(12) United States Patent
Choo et al.

(10) Patent No.: US 10,910,035 B2
(45) Date of Patent: Feb. 2, 2021

(54) DYNAMIC SEMICONDUCTOR MEMORY DEVICE AND MEMORY SYSTEM WITH TEMPERATURE SENSOR

(71) Applicant: Samsung Electronics Co., Ltd., Suwon-si (KR)

(72) Inventors: Chui Hwan Choo, Hwaseong-si (KR); Kwang Hyun Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/418,201

(22) Filed: May 21, 2019

(65) Prior Publication Data
US 2020/0176052 A1    Jun. 4, 2020

(30) Foreign Application Priority Data

Dec. 3, 2018  (KR) .................. 10-2018-0153800

(51) Int. Cl.
*G11C 11/406*  (2006.01)
*G11C 11/4091*  (2006.01)
(Continued)

(52) U.S. Cl.
CPC .......... *G11C 11/40626* (2013.01); *G11C 8/12* (2013.01); *G11C 11/4074* (2013.01);
(Continued)

(58) Field of Classification Search
CPC .......... G11C 11/40626; G11C 11/4096; G11C 11/4091; G11C 11/4085; G11C 11/4099;
(Continued)

(56) References Cited

U.S. PATENT DOCUMENTS 5,784,328 A    7/1998 Irrinki
7,035,131 B2    4/2006 Huang
(Continued)

FOREIGN PATENT DOCUMENTS

KR    0121778    12/1997
KR    100869360    11/2008

*Primary Examiner* — Sultana Begum
(74) *Attorney, Agent, or Firm* — Myers Bigel, P.A

(57) ABSTRACT

Provided are a dynamic semiconductor memory device and a memory system including the same. The dynamic semiconductor memory device includes a memory cell array including a first memory cell array block including a plurality of first dynamic memory cells connected between a plurality of first word lines and a plurality of first bit lines, a second memory cell array block including a plurality of second dynamic memory cells connected between a plurality of second word lines and a plurality of second bit lines, and a sense amplification block including a plurality of sense amplifiers configured to amplify voltages of the plurality of first bit lines and voltages of the plurality of second bit lines to a first sensing supply voltage or at least one second sensing voltage higher than the first sensing supply voltage; a temperature sensor unit configured to sense a temperature and generate a temperature sensing signal; and a voltage generator configured to generate the first sensing supply voltage or the at least one second sensing supply voltage in response to the temperature sensing signal and to apply the first sensing supply voltage or the at least one second sensing supply voltage to the memory cell array and to apply a sensing ground voltage to the memory cell array.

20 Claims, 9 Drawing Sheets

(51) Int. Cl.
  *G11C 11/4074* (2006.01)
  *G11C 11/4096* (2006.01)
  *G11C 11/4094* (2006.01)
  *G11C 11/4099* (2006.01)
  *G11C 11/408* (2006.01)
  *G11C 8/12* (2006.01)

(52) U.S. Cl.
  CPC ...... *G11C 11/4085* (2013.01); *G11C 11/4087* (2013.01); *G11C 11/4091* (2013.01); *G11C 11/4094* (2013.01); *G11C 11/4096* (2013.01); *G11C 11/4099* (2013.01)

(58) Field of Classification Search
  CPC ............ G11C 11/4094; G11C 11/4074; G11C 11/4087
  See application file for complete search history.

(56) References Cited

U.S. PATENT DOCUMENTS

| | | | |
|---|---|---|---|
| 7,051,260 B2 | 5/2006 | Ito | |
| 8,111,574 B2 | 2/2012 | Kim | |
| 9,432,298 B1* | 8/2016 | Smith | H04L 49/9057 |
| 2009/0002057 A1 | 1/2009 | Hwang | |
| 2009/0176146 A1* | 7/2009 | Matsuura | H01M 10/48 |
| | | | 429/90 |
| 2012/0099389 A1* | 4/2012 | Park | G11C 11/40622 |
| | | | 365/200 |
| 2012/0113551 A1* | 5/2012 | Huang | H02H 5/041 |
| | | | 361/18 |
| 2013/0002217 A1 | 1/2013 | Kim | |
| 2015/0131389 A1* | 5/2015 | Furutani | G11C 8/12 |
| | | | 365/189.05 |
| 2015/0256153 A1 | 9/2015 | Lim | |
| 2017/0062040 A1 | 3/2017 | Cho | |
| 2017/0147019 A1 | 5/2017 | Kim | |

* cited by examiner

DYNAMIC SEMICONDUCTOR MEMORY DEVICE AND MEMORY SYSTEM WITH TEMPERATURE SENSOR

CROSS-REFERENCE TO RELATED APPLICATION

This U.S. non-provisional patent application claims priority under 35 U.S.C. § 119 to and the benefit of Korean Patent Application No. 10-2018-0153800, filed on Dec. 3, 2018, in the Korean Intellectual Property Office (KIPO), the disclosure of which is incorporated herein by reference in its entirety.

BACKGROUND

1. Field

Devices and systems consistent with the present inventive concept relate to a dynamic semiconductor memory device and a memory system including the same.

2. Discussion of Related Art

A dynamic semiconductor memory device (e.g., a dynamic random access memory (DRAM) device) includes a plurality of dynamic memory cells, and each of the plurality of dynamic memory cells may include one transistor and one capacitor. Charges accumulated in the capacitors of the plurality of dynamic memory cells of the dynamic semiconductor memory device may leak and, thus, a refresh operation may be periodically performed to refresh the charges accumulated in the capacitors of the plurality of dynamic memory cells. As the temperature of the dynamic semiconductor memory device increases, the charges accumulated in the capacitors of the plurality of dynamic memory cells may leak more quickly.

SUMMARY

The example embodiments of the present inventive concept are directed to providing a dynamic semiconductor memory device configured to compensate for charges leaking from a plurality of dynamic memory cells thereof as the temperature of the dynamic semiconductor memory device increases and a memory system including the same.

The scope of the inventive concept is not limited to the above-described object, and other unmentioned objects may be clearly understood by those skilled in the art from the following description.

According to an example embodiment of the present inventive concept, there is provided a dynamic semiconductor memory device including a memory cell array having a first memory cell array block including a plurality of first dynamic memory cells connected between a plurality of first word lines and a plurality of first bit lines, a second memory cell array block including a plurality of second dynamic memory cells connected between a plurality of second word lines and a plurality of second bit lines, and a sense amplification block including a plurality of sense amplifiers configured to amplify voltages of the plurality of first bit lines and voltages of the plurality of second bit lines to a first sensing supply voltage or at least one second sensing voltage higher than the first sensing supply voltage during a sense amplification operation; a temperature sensor unit configured to sense a temperature and generate a temperature sensing signal; and a voltage generator configured to generate the first sensing supply voltage or the at least one second sensing supply voltage in response to the temperature sensing signal and to apply the first sensing supply voltage or the at least one second sensing supply voltage to the memory cell array and to apply a sensing ground voltage to the memory cell array.

A dynamic semiconductor memory device according to an example embodiment of the present inventive concept includes a memory cell array having a plurality of dynamic memory cells connected between a plurality of word lines and a plurality of bit lines and a plurality of sense amplifiers configured to amplify data of the plurality of bit lines, a temperature sensor unit configured to sense a temperature and to generate a temperature sensing signal, and a voltage generator configured to generate a first sensing supply voltage or at least one second sensing supply voltage higher than the first sensing supply voltage in response to the temperature sensing signal and to apply the first sensing supply voltage or the at least one second sensing supply voltage to the memory cell array and to apply a sensing ground voltage to the memory cell array. The plurality of sense amplifiers are further configured to amplify voltages of bit lines corresponding to dynamic memory cells connected to at least one word line selected from among the plurality of word lines to either the first sensing supply voltage or the at least one second sensing supply voltage during a sense amplification operation.

A memory system according to an example embodiment of the present inventive concept includes a controller configured to transmit a command and address and to transmit or receive data, and a dynamic memory configured to receive the command and address and to transmit or receive the data. The dynamic memory includes a memory cell array having a plurality of dynamic memory cells connected between a plurality of word lines and a plurality of bit lines and a plurality of sense amplifiers configured to amplify data of the plurality of bit lines, a temperature sensor unit configured to sense a temperature and generate a temperature sensing signal, and a voltage generator configured to generate a first sensing supply voltage or at least one second sensing supply voltage higher than the first sensing supply voltage in response to the temperature sensing signal and to apply the first sensing supply voltage or the at least one second sensing supply voltage to the memory cell array and to apply a sensing ground voltage to the memory cell array. The plurality of sense amplifiers amplify voltages of bit lines corresponding to dynamic memory cells connected to at least one word line selected from among the plurality of word lines to either the first sensing supply voltage or the at least one second sensing supply voltage during a sense amplification operation.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
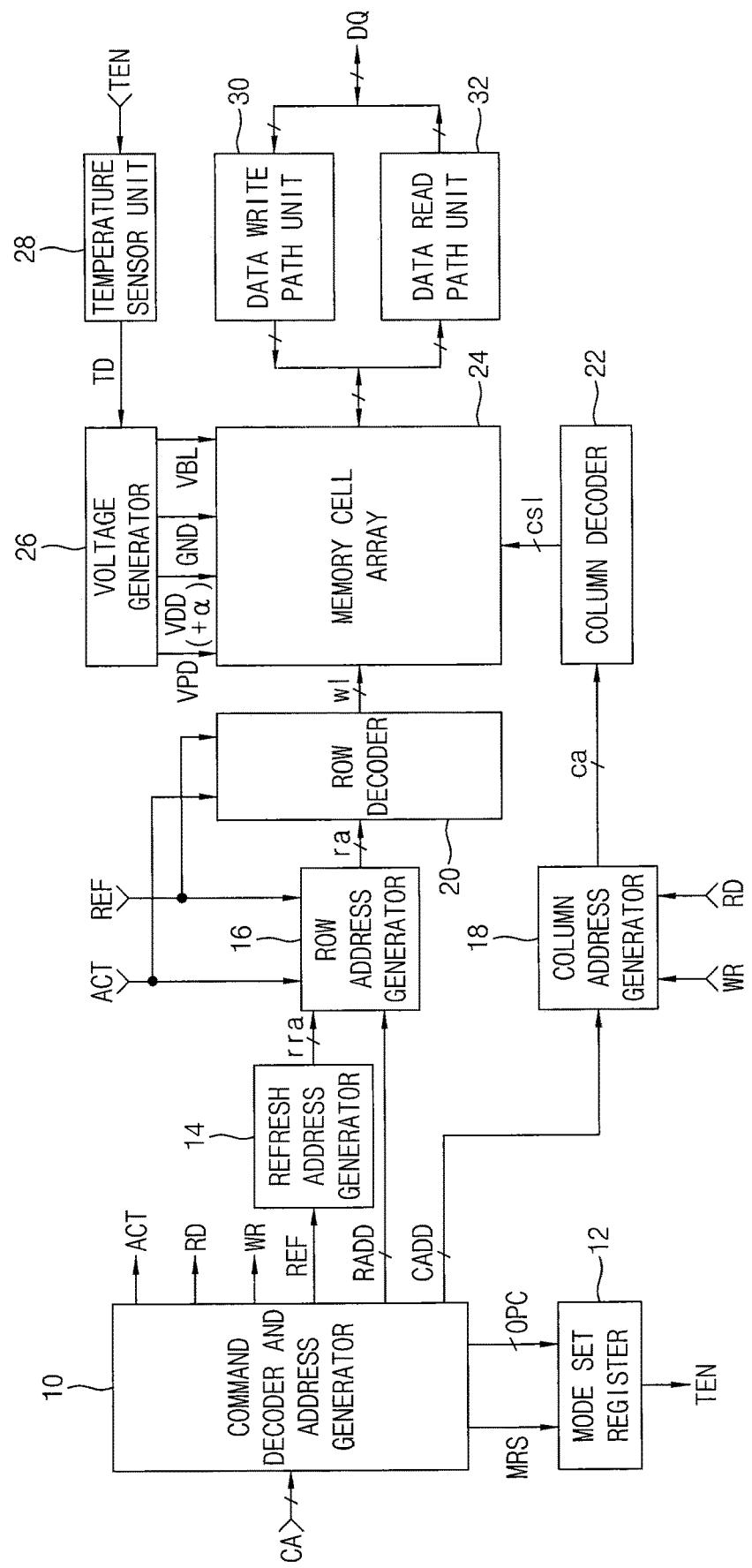
FIG. 1 is a block diagram illustrating a dynamic semiconductor memory device according to some embodiments of the inventive concept.

The inventive concept will now be described more fully with reference to the accompanying drawings, in which example embodiments of the inventive concept are shown. Like reference numerals may refer to like elements throughout this description. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of a dynamic semiconductor memory device according to some embodiments of the present inventive concept. A dynamic semiconductor memory device 100 may include a command decoder and address generator 10, a mode set register 12, a refresh address generator 14, a row address generator 16, a column address generator 18, a row decoder 20, a column decoder 22, a memory cell array 24, a voltage generator 26, a temperature sensor unit 28, a data write path unit 30, and a data read path unit 32. The dynamic semiconductor memory device may be a dynamic random access memory (DRAM) device.

Example functions of the blocks illustrated in FIG. 1 will be described below.

The command decoder and address generator 10 may receive a command and address CA applied from outside of the DRAM device 100, generate a command, e.g., an active command ACT, a read command RD, a write command WR, a refresh command REF, and/or a mode set command MRS by decoding a command signal included in the command and address CA and generate a row address RADD, a column address CADD, and/or mode set code OPC from an address signal included in the command and address CA.

The mode set register 12 may generate a temperature sensor enable signal TEN in response to the mode set code OPC.

The refresh address generator 14 may generate a refresh address rra in response to the refresh command REF.

The row address generator 16 may generate a row address signal ra from the row address RADD in response to the active command ACT and generate a row address signal ra from the refresh address rra in response to the refresh command REF.

The column address generator 18 may generate a column address signal ca from the column address CADD in response to the write command WR or the read command RD.

The row decoder 20 may generate word line selection signals wl by decoding the row address signal ra.

The column decoder 22 may generate column selection signals csl by decoding the column address signal ca.

The memory cell array 24 may include a plurality of dynamic memory cells (not shown), store data in dynamic memory cells selected by the word line selection signals wl and the column selection signals csl in response to the write command WR, and output data from dynamic memory cells selected by the word line selection signals wl and the column selection signals csl in response to the read command RD. In addition, the memory cell array 24 may perform a refresh operation on dynamic memory cells selected by at least one word line selection signal in response to the refresh command REF.

The voltage generator 26 may generate a high voltage VPP, a first or second sensing supply voltage VDD or VDD+α, a sensing ground voltage GND, and a precharge voltage VBL. In response to a temperature sensing signal TD, the voltage generator 26 may generate the first sensing supply voltage VDD when the temperature sensing signal TD is inactive and generate the second sensing voltage VDD+α that is higher than the first sensing supply voltage VDD when the temperature sensing signal TD is active. As another example, the voltage generator 26 may generate the first sensing supply voltage VDD when the temperature sensing signal TD indicates that a temperature does not exceed a specific temperature and may generate the second sensing supply voltage VDD+α, which increases proportionally as the temperature increases when the temperature sensing signal TD indicates that the temperature exceeds the specific temperature. Here, α may represent a voltage that increases linearly or in steps from the first sensing supply voltage VDD as the temperature increases.

The temperature sensor unit 28 may sense the temperature in response to the temperature sensor enable signal TEN and deactivate the temperature sensing signal TD when the temperature does not exceed the specific temperature and activate the temperature sensing signal TD when the temperature exceeds the specific temperature. That is, the temperature sensing signal TD may be 1-bit digital data in some embodiments of the inventive concept. In other embodiments, the temperature sensing signal TD may be a plurality of bits of digital data. In this case, the temperature sensor unit 28 may generate the temperature sensing signal TD with a predetermined number of states. That is, the temperature sensor unit 28 may generate the temperature sensing signal TD having a first state when the temperature does not exceed the specific temperature and generate the temperature sensing signal TD so as to have at least two different states when the temperature exceeds the specific temperature. In other embodiments, the temperature sensor unit 28 may be configured to be enabled while the refresh operation is performed in response to the refresh command REF other than the temperature sensor enable signal TEN or may be configured to be enabled in response to the write command WR or the read command RD as well as in response to the refresh command REF.

The data write path unit 30 may receive data DQ applied from the outside of the DRAM device 100 and transmit it to the memory cell array 24 in response to the write command WR.

The data read path unit 32 may output, as the data DQ, data output from the memory cell array 24 in response to the read command RD.

Figure 2:
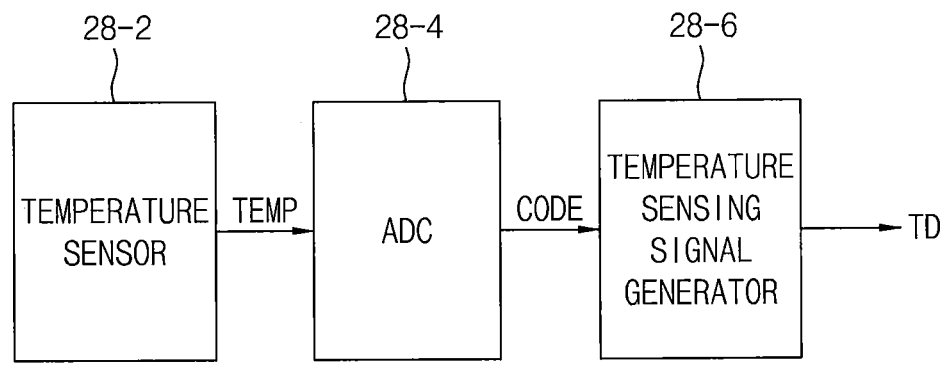
FIG. 2 is a block diagram of the temperature sensor unit of FIG. 1 according to some embodiments of the inventive concept.

FIG. 2 is a block diagram of the temperature sensor unit 28 according to some embodiments of the present inventive concept. The temperature sensor unit 28 may include a temperature sensor 28-2, an analog-to-digital converter (ADC) 28-4, and a temperature sensing signal generator 28-6.

Example functions of the blocks illustrated in FIG. 2 will be described below.

The temperature sensor 28-2 may generate a temperature signal TEMP, which increases according to temperature. In some embodiments, the temperature signal TEMP may be a voltage or current that increases according to temperature.

The ADC 28-4 may generate a digital signal CODE by converting the temperature signal TEMP, which is an analog signal, into a digital signal. The digital signal CODE may be a predetermined number of bits of digital data.

The temperature sensing signal generator 28-6 may activate the temperature sensing signal TD when the digital signal CODE exceeds specific digital data corresponding to a specific temperature. That is, the temperature sensing signal generator 28-6 may deactivate the temperature sensing signal TD when the digital signal CODE does not exceed the specific digital data and activate the temperature sensing signal TD when the digital signal CODE exceeds the specific digital data. That is, in some embodiments, the temperature sensing signal TD may be 1-bit digital data.

Figure 3:
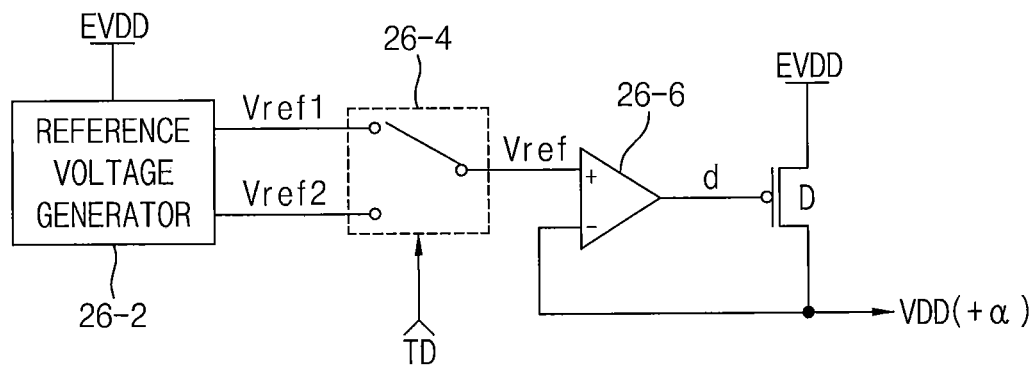
FIG. 3 is a diagram illustrating some components of the voltage generator of FIG. 1 according to some embodiments of the present inventive concept.

FIG. 3 is a diagram illustrating some components of the voltage generator 26 according to some embodiments of the present inventive concept. The voltage generator 26 may be a supply voltage generator, which includes a reference voltage generator 26-2, a switch 26-4, a comparator 26-6, and a driver D. The driver D may be a PMOS transistor.

Operations of the voltage generator 26 illustrated in FIG. 3, according to some embodiments of the inventive concept, will be described below.

The reference voltage generator 26-2 may be supplied with an external supply voltage EVDD and generate a first reference voltage Vref1 and a second reference voltage Vref2.

The switch 26-4 may generate the first reference voltage Vref1 or the second reference voltage Vref2 as a reference voltage Vref in response to the temperature sensing signal TD. The second reference voltage Vref2 may be higher than the first reference voltage Vref1.

The comparator 26-6 may compare the reference voltage Vref with the first sensing supply voltage VDD or the second sensing supply voltage VDD+α and generate a driving signal d when the first sensing supply voltage VDD or the second sensing supply voltage VDD+α is lower than the reference voltage Vref. For example, the comparator 26-6 may generate the driving signal d having a "low" level when the first sensing supply voltage VDD or the second sensing supply voltage VDD+α is lower than the reference voltage Vref.

The driver D may be turned on and drive the first sensing supply voltage VDD or the second sensing supply voltage VDD+α in response to the driving signal d.

Figure 4A:
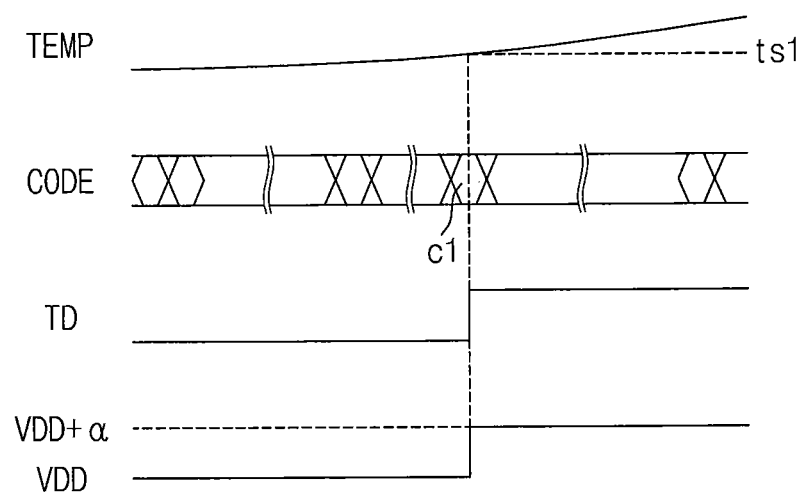
FIGS. 4A and 4B are timing diagrams that illustrate operations of a dynamic semiconductor memory device according to some embodiments of the inventive concept.
Figure 4B:
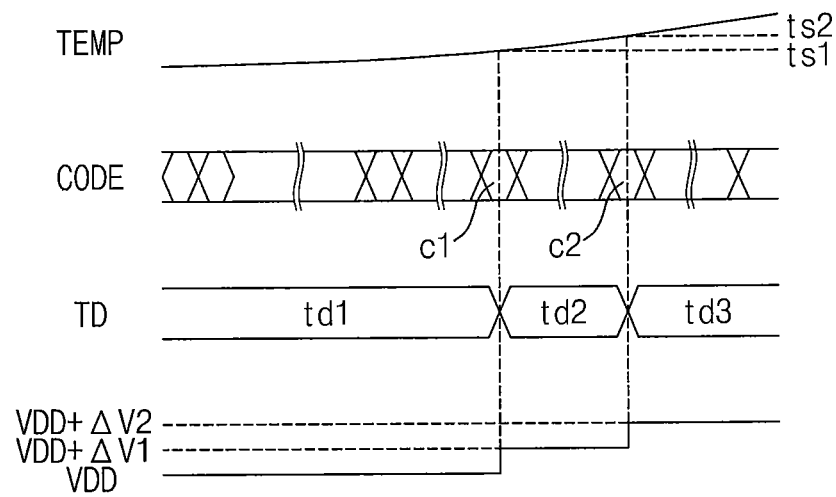

FIGS. 4A and 4B are operational timing diagrams illustrating operations of the temperature sensor unit 28 and the voltage generator 26 according to some embodiments of the present inventive concept.

Referring to FIGS. 2 to 4A, the temperature sensor 28-2 may generate the temperature signal TEMP. The temperature signal TEMP may be a voltage or current, which increases as temperature increases. The ADC 28-4 may convert the temperature signal TEMP, which is an analog signal into a digital signal CODE. For example, if the digital signal CODE is 4-bit digital data, a specific temperature ts1 is 90° C., and specific digital data corresponding to the specific temperature ts1 is c1, e.g., "0111", the temperature sensing signal generator 28-6 may activate the temperature sensing signal TD when the specific digital data exceeds c1. When the temperature sensing signal TD is inactive, the switch 26-4 may generate the first reference voltage Vref1 and the voltage generator 26 may generate the first sensing supply voltage VDD. When the temperature sensing signal TD is active, the switch 26-4 may generate the second reference voltage Vref2 and the voltage generator 26 may generate the second sensing supply voltage VDD+α, which is a fixed voltage. That is, the voltage generator 26 may generate the first sensing supply voltage VDD when the specific digital data does not exceed the specific temperature ts1 and generate the second sensing supply voltage VDD+α when the specific digital data exceeds the specific temperature ts1.

In other embodiments of the inventive concept, referring to FIGS. 2, 3 and 4B, the ADC 28-4 may convert the temperature signal TEMP, which is an analog signal, into the digital signal CODE. For example, if the digital signal CODE is 4-bit digital data, a first specific temperature ts1 is 90° C., first specific digital data corresponding to the first specific temperature ts1 is c1, e.g., "0111", a second specific temperature ts2 is 110° C., and second specific digital data corresponding to the second specific temperature ts2 is c2, e.g., "1101", the temperature sensing signal generator 28-6 may generate a temperature sensing signal TD having a first state td1 when the digital signal CODE does not exceed c1, generate a temperature sensing signal TD having a second state td2 when the digital signal CODE exceeds c1 and does not exceed c2, and generate a temperature sensing signal TD having a third state td3 when the digital signal CODE exceeds c2. Thus, according to some embodiments of the inventive concept, the reference voltage generator 26-2 may generate three first to third reference voltages, and the switch 26-4 may generate the first reference voltage in response to the temperature sensing signal TD having the first state td1, generate the second reference voltage in response to the temperature sensing signal TD having the second state td2, and generate the third reference voltage in response to the temperature sensing signal TD having the third state td3. Accordingly, the voltage generator 26 may generate the first sensing supply voltage VDD when the digital signal CODE does not exceed first specific temperature ts1, generate a second sensing supply voltage VDD+Δv1 when the digital signal CODE exceeds the first specific temperature ts2 and does not exceed the second specific temperature ts2, and generate a third sensing supply voltage VDD+Δv2 when the digital signal CODE exceeds the second specific temperature ts2.

As described above, the temperature sensor unit 28 and the voltage generator 26 may generate the temperature sensing signal TD having at least one state, which increases in steps as the temperature increases, and at least one second sensing supply voltage VDD+α or VDD+Δv1 and the third sensing supply voltage VDD+Δv2 when the digital signal CODE exceeds the specific temperature or the first specific temperature ts1. However, unlike that illustrated in the drawings, the temperature sensor unit 28 and the voltage generator 26 may generate the temperature sensing signal TD, which increases linearly as temperature increases, and the second sensing supply voltage, which increases linearly, when the digital signal CODE exceeds the specific temperature or the first specific temperature ts1.

Figure 5:
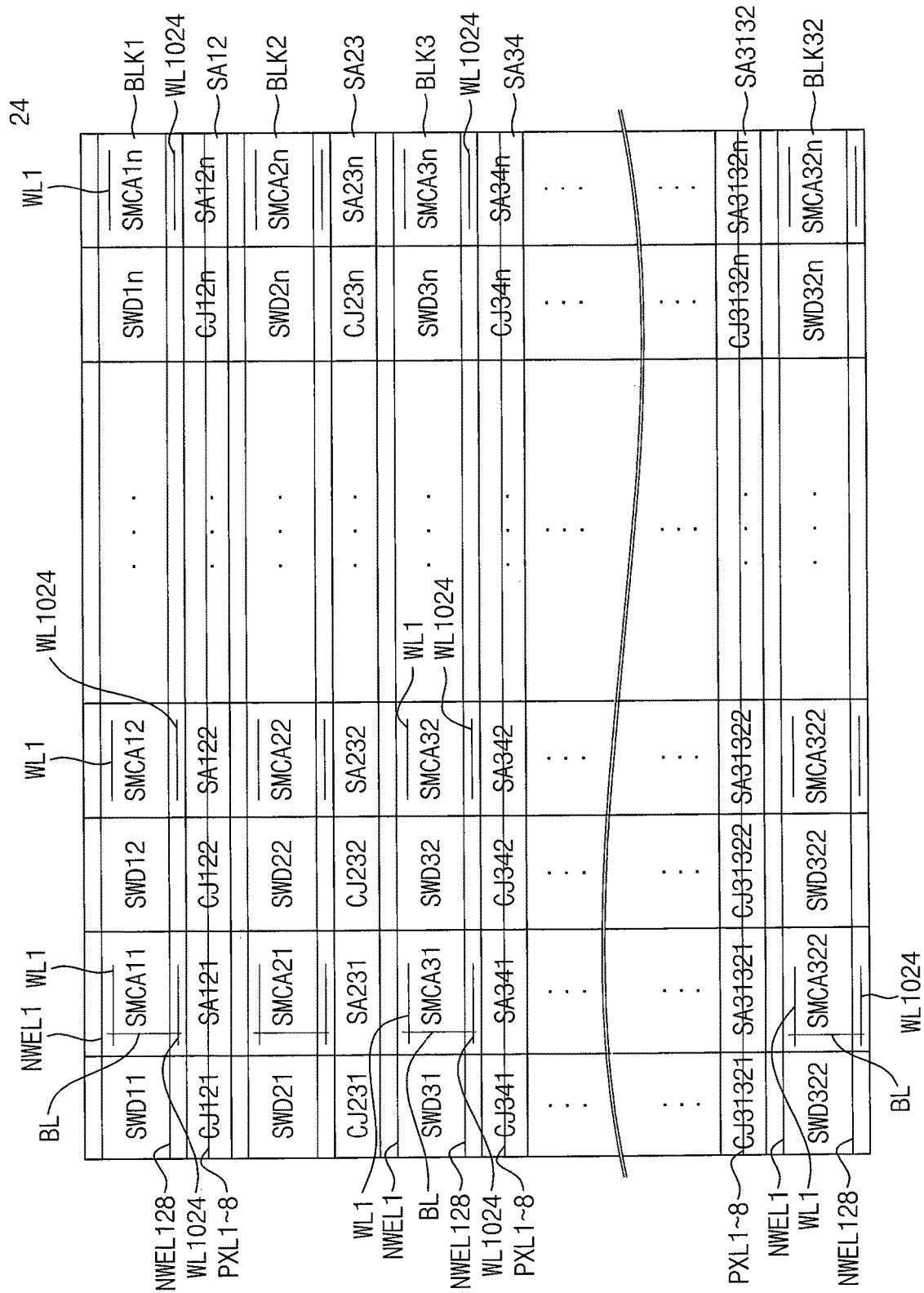
FIGS. 5 and 6 are schematics that illustrate the memory cell array of FIG. 1 according to some embodiments of the inventive concept.

FIG. 5 is a diagram schematically illustrating the memory cell array 24 according to some embodiments of the present inventive concept.

The memory cell array 24 illustrated in FIG. 5 will be described below.

The memory cell array 24 may include 32 memory cell array blocks BLK1 to BLK32, and 31 sense amplification blocks SA12 to SA3132. Each of the 32 memory cell array blocks BLK1 to BLK32 may include n sub memory cell array blocks SMCA11 to SMCA1n, SMCA21 to SMCA2n, . . . , or SMCA321 to SMCA32n, and n sub word line driver blocks SWD11 to SWD1n, SWD21 to SWD2n, . . . , or SWD321 to SWD32n. Each of the 31 sense amplification blocks SA12 to SA3132 may include n sub sense amplification blocks SA121 to SA12n, SA231 to SA23n, . . . , or SA31321 to SA3132n, and junction region blocks CJ121 to CJ12n, CJ231 to CJ23n, . . . , or CJ31321 to CJ3132n. There are 128 main word lines NWEL1 to NWEL128 and 1024 word lines WL1 to WL1024, which may be arranged in each of the 32 memory cell array blocks BLK1 to BLK32. Each of the 32 memory cell array blocks BLK1 to BLK32 may include a plurality of dynamic memory cells (not shown) connected between the 1024 word lines WL1 to WL1024 and a plurality of bit lines (not shown). Each of the 31 sense amplification blocks SA12 to SA3132 may be arranged between adjacent memory cell array blocks. There are 8 word line selection signal lines PXL1 to PXL8, which may be arranged in each of the 31 sense amplification blocks SA12 to SA3132.

The sub word line driver block SWD11, . . . SWD1n, SWD21, . . . , SWD2n, . . . , SWD321, . . . , or SWD32n arranged at a left side of each of the sub memory cell array blocks SMCA11 to SMCA1n, SMCA21 to SMCA2n, . . . , and SMCA321 to SMCA32n SMCA may select one of the word lines WL1 to WL1024 when one of the main word lines NWEL1 to NWEL128 and one of the word line selection signal lines PXL1 to PXL8 are selected. For example, the sub word line driver blocks SWD11 to SWD1n, SWD21 to SWD2n, . . . , or SWD321 to SWD32n of the memory cell array blocks BLK1 to BLK32 may select the word lines WL1 of the sub memory cell array blocks SMCA11 to SMCA1n, SMCA21 to SMCA2n, . . . , or SMCA321 to SMCA32n SMCA of each of the memory cell array blocks BLK1 to BLK32 when the main word line NWEL1 is selected and the word line selection signal line PXL1 of each of the sense amplification blocks SA12 to SA3132 is selected. The sub word line driver blocks SWD11 to SWD1n, SWD21 to SWD2n, . . . , or SWD321 to SWD32n of each of the memory cell array blocks BLK1 to BLK32 may select the word lines WL1024 of the sub memory cell array blocks SMCA11 to SMCA1n, SMCA21 to SMCA2n, . . . , or SMCA321 to SMCA32n of each of the memory cell array blocks BLK1 to BLK32 when the main word line NWEL128 of each of the memory cell array blocks BLK1 to BLK32 is selected and the word line selection signal lines PXL8 of each of the sense amplification blocks SA12 to SA3132 are selected. That is, the word lines WL1 to WL1024 of the sub memory cell array blocks SWD11 to SWD1n, SWD21 to SWD2n, . . . , or SWD321 to SWD32n of each of the memory cell array blocks BLK1 to BLK32 may be selected when one of the main word lines NWEL1 to NWEL128 and one of the word line selection signal lines PXL1 to PXL8 are selected.

Each of the 31 sense amplification blocks SA12 to SA3132 may be shared by memory cell array blocks adjacent thereto. During the refresh operation, each of the 31 sense amplification blocks SA12 to SA3132 may amplify data read through bit lines (not shown) from a plurality of dynamic memory cells connected to a selected word line of one memory cell array block adjacent thereto and rewrite the amplified data. The 31 sense amplification blocks SA12 to SA3132 are configured to be shared by two adjacent memory cell array blocks but may not be simultaneously used to perform the refresh operation on the two adjacent memory cell array blocks.

In some embodiments, the high voltage VPP generated by the voltage generator 26 of FIG. 1 may be applied to the sub word line driver blocks SWD11 to SWD1n, SWD21 to SWD2n, . . . , and SWD321 to SWD32n, the sensing supply voltage VDD or VDD+α and the sensing ground voltage GND may be applied to the junction region blocks CJ121 to CJ12n, CJ231 to CJ23n, . . . , and CJ31321 to CJ3132n, and the precharge voltage VBL may be applied to the sense amplification blocks SA12, SA23, . . . , SA3132.

Figure 6:
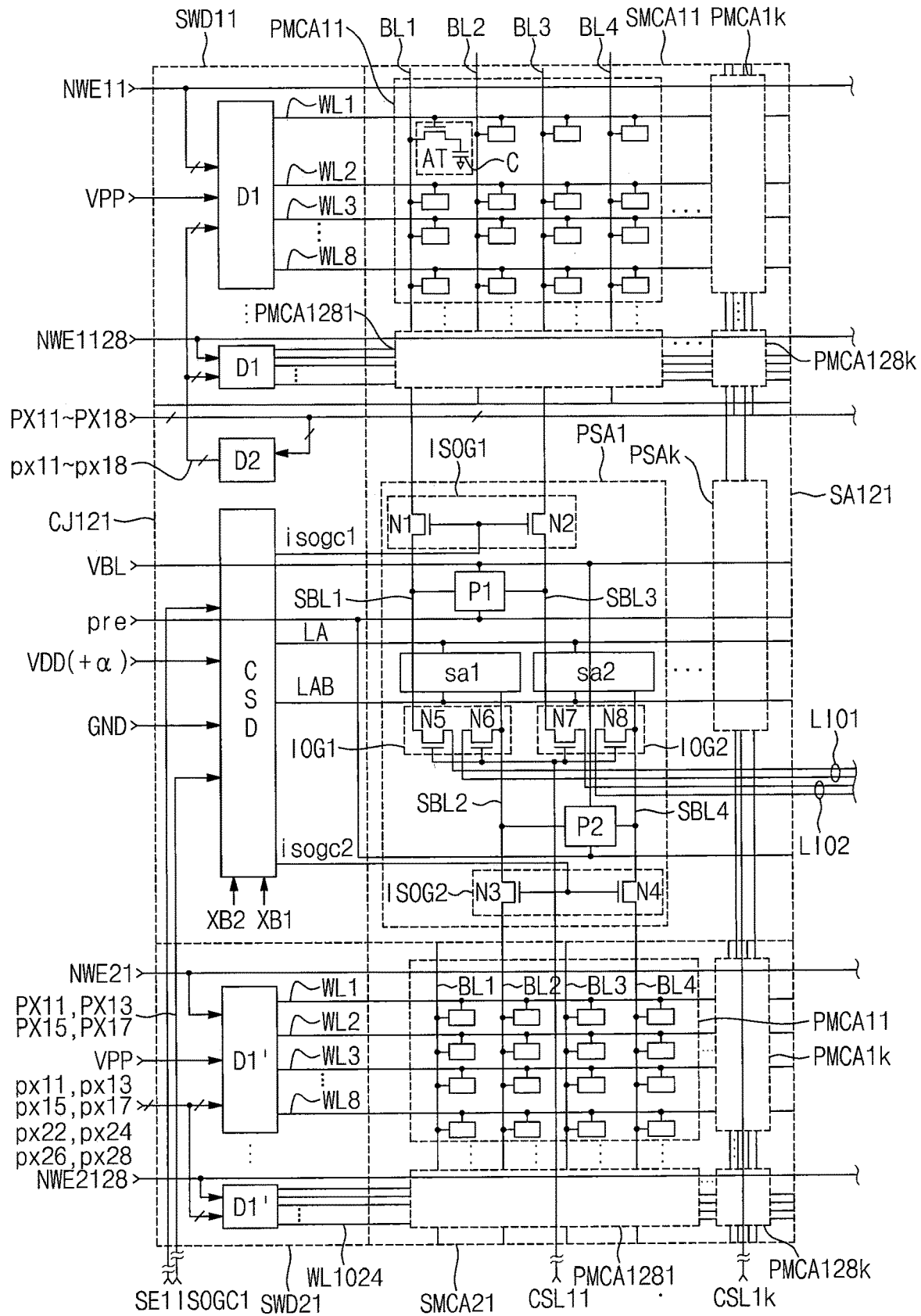

FIG. 6 is a detailed diagram illustrating some components of the memory cell array 24, according to some embodiments of the present inventive concept, in which the structures of the sub word line driver block SWD11, the sub memory cell array block SMCA11, the junction region block CJ121, the sub sense amplification block SA121, the sub word line driver block SWD21, and the sub memory cell array block SMCA21 of the memory cell array 24 are illustrated in detail. The memory cell array 24 may have an open bit line structure.

Referring to FIG. 6, each of the sub memory cell array blocks SMCA11 and SMCA21 may include 128×k partial blocks PMCA11 to PMCA1k, . . . , PMCA1281 to PMCA128k. Each of the 128×k partial blocks PMCA11 to PMCA1k, . . . , PMCA1281 to PMCA128k may include 32 dynamic memory cells MC connected between eight sub word lines WL1 to WL8 and four odd-numbered and even-numbered bit lines BL1 to BL4. Each of the dynamic memory cells MC may include an access transistor AT connected between a sub word line and an odd-numbered or even-numbered bit line, and a capacitor C connected between the access transistor AT and a voltage (e.g., a ground voltage). The memory cell array 24 may have the open bit line structure, in which each of the odd-numbered bit lines BL1 and BL3 in the sub memory cell array block SMCA11 and each of the even-numbered bit lines BL2 and BL4 in the sub memory cell array block SMCA21 form a pair of bit lines. The sub word line driver block SWD11 may include sub word line drivers D1. Each of the sub word line drivers D1 may be supplied with the high voltage VPP and may select the eight sub word lines WL1 to WL8 in the sub memory cell array block MCA11 by driving sub word line driving selection signals px11 to px18 generated from the junction region block CJ121 in response to a corresponding main word line selection signal NWE11, . . . , or NWE1128. Each of the sub word line drivers D1 may be supplied with the high voltage VPP and may apply the high voltage VPP to a selected sub word line. The sub word line driver block SWD21 may include sub word line drivers D1'. Each of the sub word line drivers D1' may select eight sub word lines WL1 to WL8 in the sub memory cell array block SMCA21 by driving the sub word line driving selection signals px11, px13, px15, px17 generated from the junction region block CJ121 and sub word line driving selection signals px22, px24, px26, and px28 generated from a junction region block CJ231 (not shown) in response to corresponding main word line selection signals NWE21 to NWE2128. Each of the sub word line drivers D1' may be supplied with the high voltage VPP and apply the high voltage VPP to a selected sub word line. Each of the sub word line driver blocks in the memory cell array 24 may be used for a memory cell array block adjacent to a right side thereof in a word line direction X as shown in FIG. 5.

The junction region block CJ121 may include a sub word line selection signal driver D2 and a control signal driver CSD. The sub word line selection signal driver D2 may generate the sub word line driving selection signals px11 to px18 by driving the sub word line selection signals PX11 to PX18 in response to a Y block selection signal YB1. The Y block selection signal YB1 may be generated by decoding some bits of the column address CADD. The control signal driver CSD may generate first and second bit line isolation gate driving control signals isogc1 and isogc2 and a pair of sense amplification voltages LA and LAB in response to an X block selection signal XB1 or XB2, the bit line isolation gate control signal ISOGC1, and a sense amplifier control signal SE1. The control signal driver CSD may be supplied with the first or second sensing supply voltage VDD or VDD+α and the sensing ground voltage GND and transmit them as the pair of sense amplification voltages LA and LAB. The positive sensing voltage LA among the pair of sense amplification voltages LA and LAB may be the first or second sensing supply voltage VDD or VDD+α, and the negative sensing voltage LAB may be the sensing ground voltage GND. Thus, during the refresh operation of the memory cell array 24, when a temperature exceeds a specific temperature, the positive sensing voltage LA may be amplified to the second sensing supply voltage VDD+α and, thus, the amount of charges being accumulated in the capacitors C of the plurality of dynamic memory cells MC may be increased. Accordingly, even when the amount of charges leaking from the capacitors C of the plurality of dynamic memory cells MC of the memory cell array 24 increases due to an increase in a temperature, the amount of charges being accumulated in the capacitors C increases, thereby preventing or reducing loss of data stored therein. In the memory cell array 24, each of the junction region blocks may be used for the sub word line driver block adjacent to the top and/or bottom thereof in a bit line direction Y and the sub sense amplification block adjacent to a right side thereof in a word line direction X.

The sense amplification block SA121 may include k sense amplification circuits PSA1 to PSAk each including precharge circuits P1 and P2, sense amplifiers sa1 and sa2, first and second bit line isolation gates ISOG1 and ISOG2, and input/output gates IOG1 and IOG2. The precharge circuits P1 and P2 may perform a precharge operation of precharging the odd-numbered bit lines BL1 and BL3 included in the sub memory cell array block SMCA11, the even-numbered bit lines BL2 and BL4 included in the sub memory cell array block SMCA21, and sense bit lines SBL1 to SBL4 included in the sub sense amplification block SA121 to the precharge voltage VBL in response to a precharge control signal pre. The precharge operation may be an operation of simultaneously or generally concurrently precharging all bit lines and all sense bit lines included in the memory cell array 24 to the precharge voltage VBL. In the sub sense amplification block SA121, the sense amplifiers sa1 and sa2 included in the sense amplification circuits PSA1 to PSAk may respectively amplify data of the odd-numbered sense bit lines SBL1 and SBL3 connected to the odd-numbered bit lines BL1 and BL3 of the sub memory cell array block SMCA11, and data of the even-numbered sense bit lines SBL2 and SBL4 connected to the even-numbered bit lines BL2 and BL4 of the sub memory cell array block SMCA21 in response to the pair of sense amplification voltages LA and LAB. In the sub sense amplification block SA121, the first bit line isolation gate ISOG1 of each of the sense amplification circuits PSA1 to PSAk may include NMOS transistors N1 and N2, which are turned on to connect the odd-numbered bit lines BL1 and BL3 of the sub memory cell array block SMCA11 and the odd-numbered sense bit lines SBL1 and SBL3 of the sub sense amplification block SA121, in response to the first bit line isolation gate driving control signal isogc1. In the sub sense amplification block SA121, the second bit line isolation gate ISOG2 of each of the sense amplification circuits PSA1 to PSAk may include NMOS transistors N3 and N4, which are turned on to connect the even-numbered bit lines BL2 and BL4 of the sub memory cell array block SMCA21 and the even-numbered sense bit lines SBL2 and SBL4 of the sub sense amplification block SA121 in response to the second bit line isolation gate driving control signal isogc2. In the sub sense amplification block SA121, the input/output gate IOG1 of each of the sense amplification circuits PSA1 to PSAk may include NMOS transistors N5 and N6, which are turned on to connect the sense bit lines SBL1 and SBL2 and a pair of input/output lines LIO1 in response to a corresponding column selection signal CSL11, CSL12 (not shown), . . . , or CSL1k. In the sub sense amplification block SA121, the input/output gate IOG2 of each of the sense amplification circuits PSA1 to PSAk may include NMOS transistors N7 and N8, which are turned on to connect the sense bit lines SBL3 and SBL4 and a pair of input/output lines LIO2 in response to the corresponding column selection signal CSL11, CSL12 (not shown), . . . , CSL1k.

Figure 7:
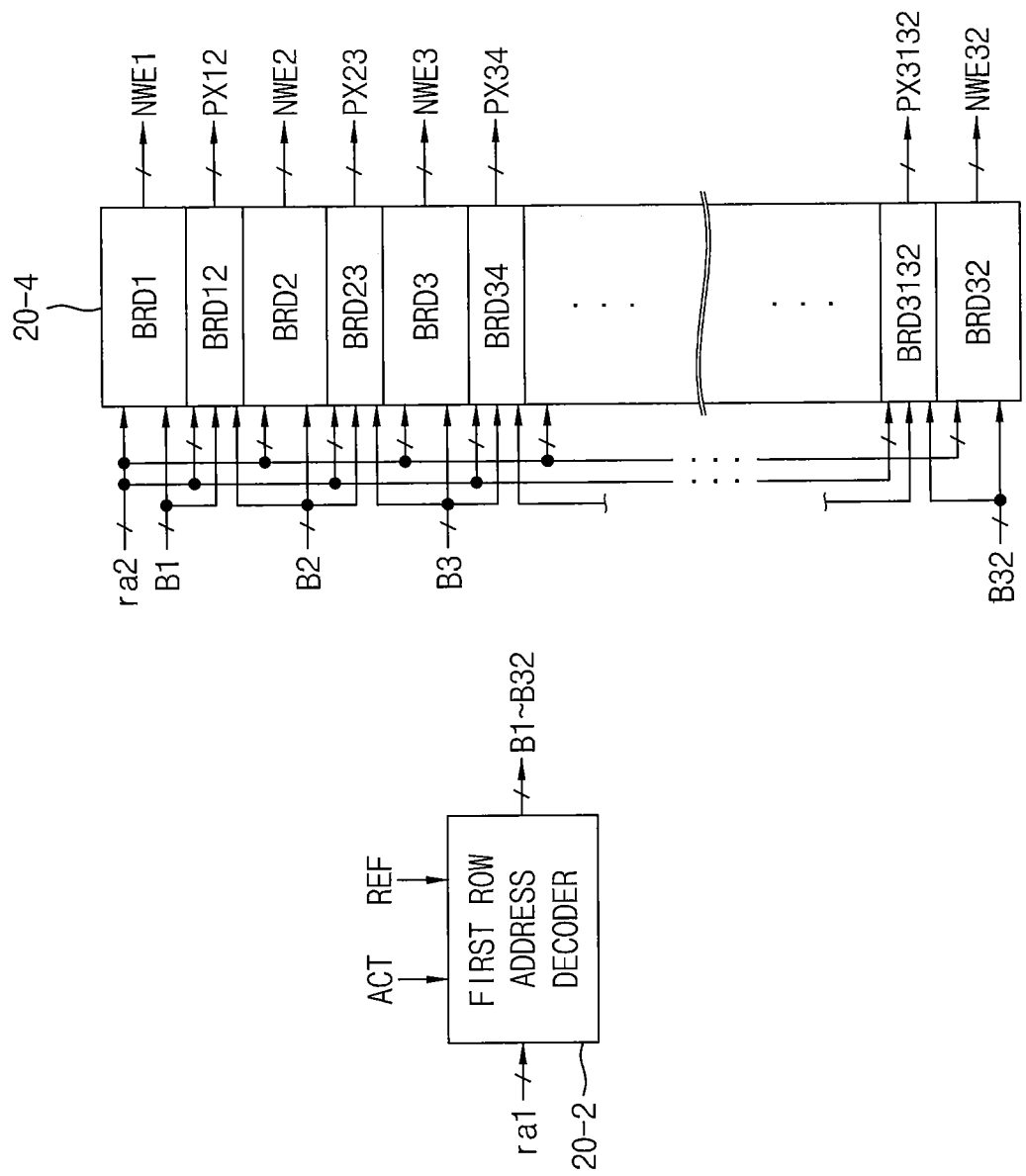
FIG. 7 is a block diagram of the row decoder of FIG. 1 according to some embodiments of the present inventive concept.

FIG. 7 is a block diagram of the row decoder 20 according to some embodiments of the present inventive concept. The row decoder 20 may include a first row address decoder 20-2 and a second row address decoder 20-4. The second row address decoder 20-4 may include first block row decoders BRD1 to BRD32 and second block row decoders BRD12 to BRD3132.

In FIG. 7, the row decoder 20 is illustrated based on an assumption that four memory cell array blocks are selected at about the same time from among the 32 memory cell array blocks BLK1 to BLK32 of FIG. 5 and the refresh operation is performed at about the same time on a plurality of dynamic memory cells connected to one word line of each of the four memory cell array blocks.

Example functions of the blocks illustrated in FIG. 7 will be described below.

The first row address decoder 20-2 may generate block selection signals B1 to B32 by decoding a 5-bit first row address signal ra1 in response to an active command ACT or a refresh command REF. The first row address decoder 20-2 may activate one of the block selection signals B1 to B32 in response to the active command ACT or may simultaneously or generally concurrently activate four block selection signals B1, B9, B17, and B25, four block selection signals B2, B10, B18, and B26, four block selection signals B3, B11, B19, and B27, four block selection signals B4, B12, B20, and B28, four block selection signals B5, B13, B21, and B29, four block selection signals B6, B14, B22, and B30, four block selection signals B7, B15, B23, and B31, or four block selection signals B8, B16, B24, and B32 in response to the refresh command REF. For example, the first row address decoder 20-2 may simultaneously or generally concurrently activate four block selection signals by decoding the lower three bits excluding the upper two bits of the 5-bit first row address signal ra1, in response to the refresh command REF.

Each of the first block row decoders BRD1 to BRD32 may generate corresponding main word line selection signals NWE1, NWE2, . . . , or NWE32 by decoding x bits of a second row address signal ra2 in response to a corresponding block selection signal B1, B2, . . . , or B32. For example, each of the first block row decoders BRD1 to BRD32 may generate the corresponding main word line selection signals NWE1, NWE2, . . . , or NWE32 by decoding the upper seven bits of a 10-bit second row address signal ra2. The number of each of the main word line selection signals NWE1 to NWE32 may be 128.

Each of the second block row decoders BRD12 to BRD3132 may generate corresponding word line selection signals PX12, PX23, . . . , or PX3132 by decoding y bits of the second row address signal ra2 in response to the corresponding block selection signal B1, B2, . . . , or B32. For example, each of the second block row decoders BRD12 to BRD3132 may generate the corresponding word line selection signals PX12, PX23, . . . , or PX3132 by decoding the lower three bits of a 10-bit first row address. The number of each of the word line selection signals PX12 to PX3132 may be eight.

The word lines WL1 to WL1024 of each of the memory cell array blocks BLK1 to BLK32 illustrated in FIG. 5 may be selected from a combination of the corresponding 128 main word line selection signals NWE1, NWE2, . . . , or NWE32 and a corresponding eight word line selection signals PX12, PX23, . . . , or PX3132.

Figure 8B:
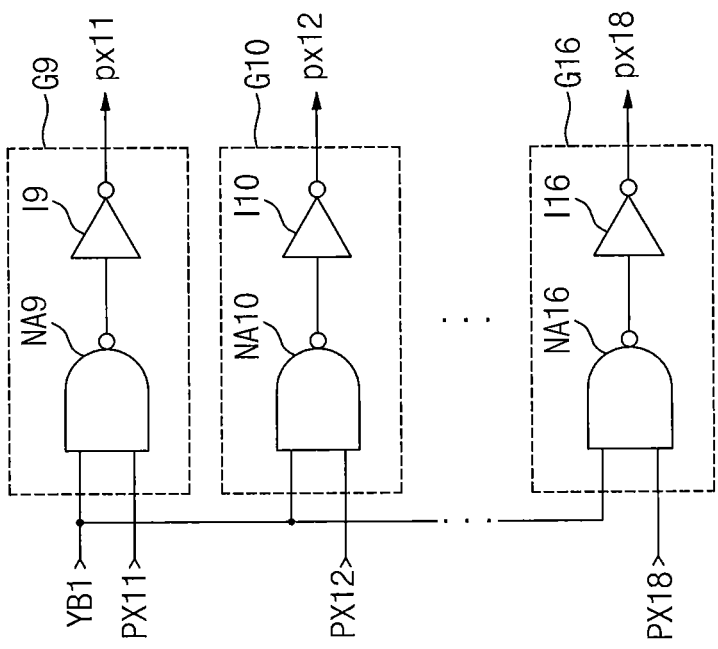
FIGS. 8A and 8B are diagrams illustrating the sub word line drivers of FIG. 6 according to some embodiments of the inventive concept.
Figure 8A:
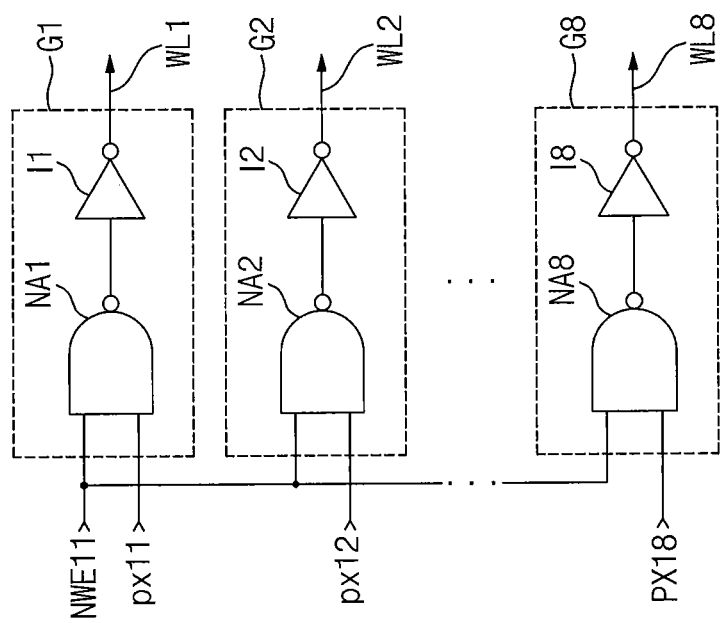

FIG. 8A is a diagram illustrating a structure of the sub word line driver D1 according to some embodiments of the present inventive concept. The sub word line driver D1 may include first to eighth logic gates G1 to G8. The first to eighth logic gates G1 to G8 may include NAND gates NA1 to NA8 and inverters I1 to I8, respectively.

In FIG. 8A, each of the first to eighth logic gates G1 to G8 may select a corresponding sub word line WL1, WL2, . . . , WL8 by performing an AND operation on a main word line selection signal NWE11 and a corresponding sub word line driving selection signal px11, px12, . . . , px18. The first to eighth logic gates G1 to G8 may generate a high voltage VPP when the sub word lines WL1 to WL8 are selected, respectively.

FIG. 8B is a diagram illustrating a structure of the sub word line driver D2 according to some embodiments of the present inventive concept. The sub word line selection signal driver D2 may include ninth to sixteenth logic gates G9 to G16. The ninth to sixteenth logic gates G9 to G16 may include NAND gates NA9 to NA16 and inverters I9 to I16, respectively.

In FIG. 8B, each of the ninth to sixteenth logic gates G9 to G16 may generate a corresponding sub word line driving selection signal px11, px12, . . . , or px18 by performing the AND operation on a Y block selection signal YB1 and a corresponding sub word line selection signal PX11, PX12, . . . or PX18.

Figure 9B:
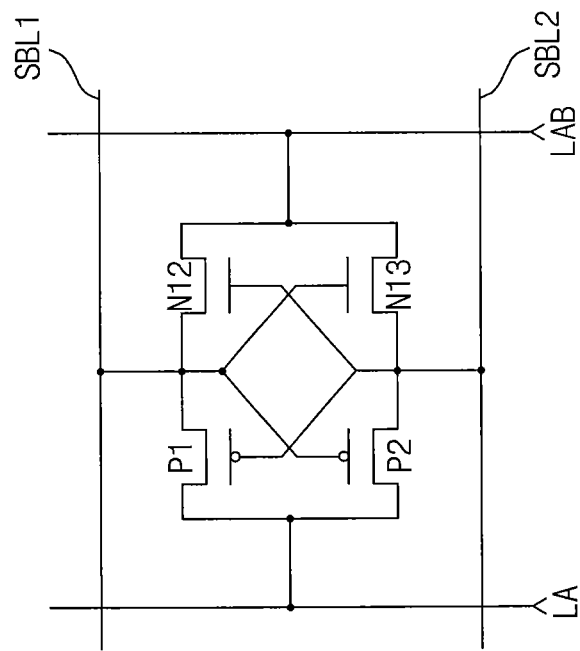
FIGS. 9A and 9B are diagrams illustrating the precharge circuit and the sense amplifier of FIG. 6, respectively, according to some embodiments of the inventive concept.
Figure 9A:
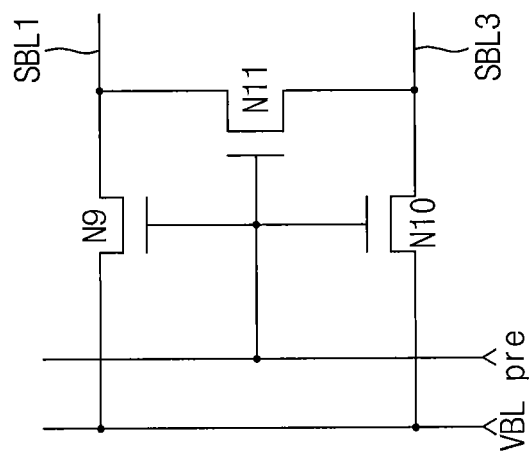

FIG. 9A is a diagram illustrating a structure of the precharge circuit P1 according to some embodiments of the present inventive concept. The precharge circuit P1 may include NMOS transistors N9 to N11.

In FIG. 9A, the NMOS transistors N9 and N10 may be turned on to precharge sense bit lines SBL1 and SBL3 to a precharge voltage VBL in response to a precharge control signal pre. The NMOS transistor N11 may be turned on to equalize voltages of the sense bit lines SBL1 and SBL3 in response to the precharge control signal pre.

FIG. 9B is a diagram illustrating a structure of a sense amplifier sa1 according to some embodiments of the present inventive concept. The sense amplifier sa1 may include PMOS transistors P1 and P2 and NMOS transistors N12 and N13.

In FIG. 9B, when a positive sensing voltage LA changes from a precharge voltage VBL to a first sensing supply voltage VDD or a second sensing supply voltage VDD+α and a negative sensing voltage LAB changes from the precharge voltage VBL to a sensing ground voltage GND, the PMOS transistors P1 and P2 may be turned on to amplify a sense bit line SBL2 or SBL1 to the first sensing supply voltage VDD or the second sensing supply voltage VDD+α when the sense bit line SBL1 or SBL2 goes to a "low" level, and the NMOS transistors N12 and N13 may be turned on to amplify the sense bit line SBL2 or SBL1 to the sensing ground voltage GND when the sense bit line SBL1 or SBL2 goes to a "high" level. That is, the sense amplifier sa1 may sense the difference between voltages of the pair of sense bit lines SBL1 and SBL2 and may amplify the sense bit line SBL2 and SBL1 to either the first sensing supply voltage VDD and the sensing ground voltage GND or the second sensing supply voltage VDD+α and the sensing ground voltage GND.

Figure 10:
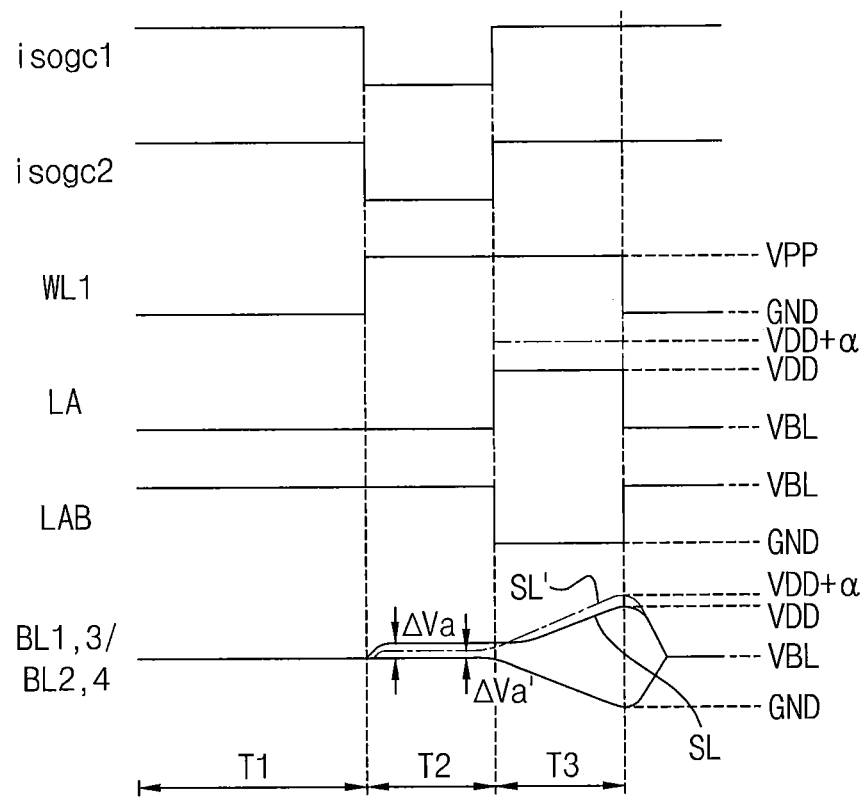
FIG. 10 is a timing diagram illustrating a refresh operation of the memory cell array of FIG. 1 according to some embodiments of the inventive concept.

FIG. 10 is an operation timing diagram illustrating a refresh operation of the memory cell array 24 according to some embodiments of the present inventive concept, in which "high" level data is stored in all a plurality of dynamic memory cells connected to sub word lines WL1 of the memory cell array blocks BLK1, BLK9, BLK17, and BLK25 of the memory cell array 24, and the sub word lines WL1 of the memory cell array blocks BLK1, BLK9, BLK17, and BLK25 are simultaneously or generally concurrently activated to perform the refresh operation on the plurality of dynamic memory cells connected to the sub word lines WL1 of the memory cell array blocks BLK1, BLK9, BLK17, and BLK25.

Referring to FIGS. 5 to 10, in a first period T1, when the precharge control signal pre is driven to a "high" level, all the precharge circuits P1 and P2 of the memory cell array 24 are enabled and, thus, all of the bit lines and the sense bit lines of the memory cell array 24 may be precharged to the precharge voltage VBL. That is, the first period T1 may be a precharge operation period in which the precharge operation is performed. In the first period T1, the control signal drivers CSD of all the junction regions of each of the sense amplification blocks may generate the first and second bit line isolation gate driving control signals isogc1 and isogc2 having "high" levels and generate the pair of sense amplification voltages LA and LAB having the precharge voltage VBL. Accordingly, both the first and second bit line isolation gates ISOG1 and ISOG2 of all the sub sense amplification blocks of all the sense amplification blocks of the memory cell array 24 may be turned on, and all the sense amplifiers sa1 and sa2 thereof may be turned off.

Referring to FIGS. 1 to 9, in a second period T2, the high voltage VPP may be applied to the sub word lines WL1 of the sub memory cell array blocks SMCA11 to SMCA1n, SMCA91 to SMCA9n, SMCA171 to SMCA17n, and SMCA251 to SMCA25n of the memory cell array blocks BLK1, BLK9, BLK17, and BLK25. Furthermore, the control signal drivers CSD of the junction region blocks CJ121 to CJ12n, CJ9101 to CJ910n, CJ17181 to CJ1718n, and CJ25261 to CJ2526n of the sense amplification blocks SA12, SA910, SA1718, and SA2526 may generate the first and second bit line isolation gate driving control signals isogc1 and isogc2 having "low" levels and generate the pair of sense amplification voltages LA and LAB having the precharge voltage VBL. Accordingly, all the first and second bit line isolation gates ISOG1 and ISOG2 of the sub sense amplification blocks SA121 to SA12n, SA9101 to SA910n, SA17181 to SA1718n, and SA25261 to SA2526n of the sense amplification blocks SA12, SA910, SA1718, and SA2526 may be turned off, and all the sense amplifiers sa1 and sa2 thereof may be turned off. Thus, a charge sharing may be performed between charges accumulated in each of dynamic memory cells connected between the sub word lines WL1 and the odd-numbered bit lines BL1 and BL3 of the sub memory cell array blocks SMCA11 to SMCA1n, SMCA91 to SMCA9n, SMCA171 to SMCA17n, and SMCA251 to SMCA25n of the memory cell array blocks BLK1, BLK9, BLK17, and BLK25 and a charge corresponding to the precharge voltage VBL of the corresponding odd-numbered bit line BL1 or BL3. Accordingly, voltages of the odd-numbered bit lines BL1 and BL3 of the sub memory cell array blocks SMCA11 to SMCA1n, SMCA91 to SMCA9n, SMCA171 to SMCA17n, and SMCA251 to SMCA25n of the memory cell array blocks BLK1, BLK9, BLK17, and BLK25 may be increased from the precharge voltage VBL by a third predetermined voltage ΔVa. That is, the second period T2 may be a charge sharing period in which the charge sharing is performed. In this case, when the charges accumulated in the dynamic memory cells decrease as a temperature increases, the voltages of the odd-numbered bit lines BL1 and BL3 may be increased from the precharge voltage VBL by a fourth predetermined voltage ΔVa' (which is lower than the third predetermined voltage ΔVa) as indicated by an alternate long and shortdash line in FIG. 10.

Referring to FIGS. 1 to 10, in a third period T3, the high voltage VPP may be applied to the sub word lines WL1 of sub memory cell array blocks SMCA11 to SMCA1n, SMCA91 to SMCA9n, SMCA171 to SMCA17n, and SMCA251 to SMCA25n of the memory cell array blocks BLK1, BLK9, BLK17, and BLK25. The control signal drivers CSD of the junction region blocks CJ121 to CJ12n, CJ9101 to CJ910n, CJ17181 to CJ1718n, and CJ25261 to CJ2526n of the sense amplification blocks SA12, SA910, SA1718, and SA2526 may generate the first and second bit line isolation gate driving control signals isogc1 and isogc2 having "high" levels and generate the pair of sense amplification voltages LA and LAB having the first sensing supply voltage VDD and the sensing ground voltage GND. Thus, all the first and second bit line isolation gates ISOG1, ISOG2 of the sub sense amplification blocks SA121 to SA12n, SA9101 to SA910n, SA17181 to SA1718n, and SA25261 to SA2526n of the sense amplification blocks SA12, SA910, SA1718, and SA2526 may be turned on and all the sense amplifiers sa1 and sa2 thereof may be enabled, thereby amplifying the voltages of the odd-numbered bit lines BL1 and BL3 to the first sensing supply voltage VDD (see a graph SL of FIG. 10). Thus, the dynamic memory cells connected between the sub word lines WL1 and the odd-numbered bit lines BL1 and BL3 of sub memory cell array blocks SMCA11 to SMCA1n, SMCA91 to SMCA9n, SMCA171 to SMCA17n, and SMCA251 to SMCA25n of the memory cell array blocks BLK1, BLK9, BLK17, and BLK25 may be stored again by the sensing supply voltage VDD. That is, the third period T3 may be a sense amplification period. In this case, when the charges accumulated in the dynamic memory cells decrease due to an increase in a temperature, the second sensing supply voltage VDD+α and the sensing ground voltage GND may be applied to the sense amplifiers sa1 and sa2 of the sub sense amplification blocks SA121 to SA12n, SA9101 to SA910n, SA17181 to SA1718n, and SA25261 to SA2526n of the sense amplification blocks SA12, SA910, SA1718, SA2526, and the voltages of the odd-numbered bit lines BL1 and BL3 may be amplified to the second sensing supply voltage VDD+α (see a graph SL' of FIG. 10) as indicated by an alternate long and short dash line in FIG. 10. Accordingly, even when the charges accumulated in the dynamic memory cells leak and decrease due to an increase in a temperature, the odd-numbered bit lines BL1 and BL3 may be amplified to the second sensing supply voltage VDD+α by applying the second sensing supply voltage VDD+α to the sense amplifiers sa1 and sa2, thereby compensating for the leakage of the charges of the dynamic memory cells.

All the dynamic memory cells of the memory cell array 24 may be refreshed by repeatedly performing the refresh operation, according to some embodiments of the inventive concept, as described above.

A dynamic semiconductor memory device according to some embodiments of the present inventive concept may be configured to generate either a fixed second sensing supply voltage VDD+α or second sensing supply voltages VDD+α, which increase in steps or linearly as the temperature increases when the temperature exceeds the specific temperature even during a write operation and a read operation, as well as during the refresh operation.

The sense amplification operation described above may be performed during the write or read operation, as well as during the refresh operation.

The memory cell array of the dynamic semiconductor memory device described above may have the open bit line structure in some embodiments, but may have a folded bit line structure in other embodiments. In the memory cell array having the open bit line structure, a reference bit line is located in a memory cell array block adjacent thereto, whereas in a memory cell array having the folded bit line structure, a reference bit line may be located in the same memory cell array block. A memory cell array of a semiconductor memory device according to some embodiments of the present inventive concept may be configured to amplify data of each of bit lines corresponding to dynamic memory cells, which are connected to at least one word line selected from among a plurality of word lines, to a first sensing supply voltage VDD or at least one second sensing supply voltage VDD+α applied according to a temperature or to a sensing ground voltage GND during a sense amplification operation regardless of a bit line structure.

Figure 11:
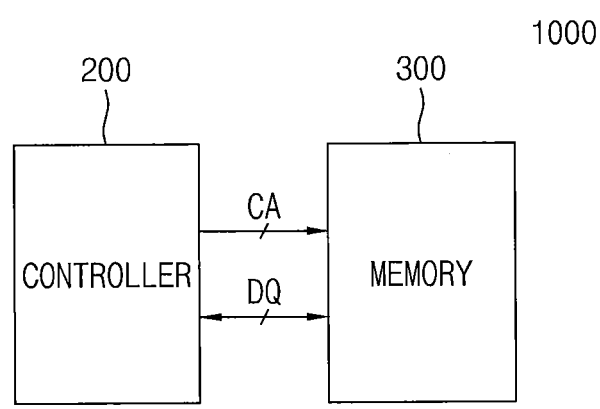
FIG. 11 is a block diagram of a memory system according to some embodiments of the inventive concept.

FIG. 11 is a block diagram of a memory system according to some embodiments of the present inventive concept. A memory system 1000 may include a controller 200 and a dynamic memory 300. The dynamic memory 300 may be either a dynamic semiconductor memory device, or a memory module having including a plurality of dynamic semiconductor memory devices.

Example functions of the blocks illustrated in FIG. 11 will be described below.

The controller 200 may transmit a command and address CA and receive or output data DQ.

The dynamic memory 300 may receive the command and address CA and receive or output the data DQ. The dynamic memory 300 may be the dynamic semiconductor memory device described above with reference to FIGS. 1 to 10 in accordance with some embodiments of the inventive concept. That is, when a temperature exceeds a specific temperature, the dynamic memory 300 may generate a fixed second sensing supply voltage VDD+α, which is higher than a first sensing supply voltage VDD, or the second sensing supply voltage VDD+α, which increases in steps or linearly as the temperature increases.

According to example embodiments of the present inventive concept, even when charges accumulated in dynamic memory cells of a dynamic semiconductor memory device leak quickly as temperature increases, the leaking charges may be compensated for by sensing the temperature and increasing a sensing supply voltage and increasing a sensing voltage during a sense amplification operation. Accordingly, the reliability of operations of the dynamic semiconductor memory device and a memory system including the same can be improved.

While the embodiments of the present inventive concept have been described with reference to the accompanying drawings, it should be understood by those skilled in the art that various modifications may be made without departing from the scope of the present inventive concept and without changing essential features thereof. Therefore, the above-described embodiments should be considered in a descriptive sense only and not for purposes of limitation.

What is claimed is:

1. A dynamic semiconductor memory device comprising:
   a memory cell array comprising:
      a first memory cell array block comprising a plurality of first dynamic memory cells connected between a plurality of first word lines and a plurality of first bit lines;
      a second memory cell array block comprising a plurality of second dynamic memory cells connected between a plurality of second word lines and a plurality of second bit lines; and
      a sense amplification block comprising a plurality of sense amplifiers configured to amplify voltages of the plurality of first bit lines and voltages of the plurality of second bit lines to a first sensing supply voltage or at least one second sensing supply voltage higher than the first sensing supply voltage during a sense amplification operation;
   a temperature sensor unit configured to sense a temperature and generate a temperature sensing signal; and
   a voltage generator configured to generate the first sensing supply voltage or the at least one second sensing supply voltage in response to the temperature sensing signal and to apply the first sensing supply voltage or the at least one second sensing supply voltage to the memory cell array and to apply a sensing ground voltage to the memory cell array.

2. The dynamic semiconductor memory device of claim 1, wherein the temperature sensor unit is further configured to generate the temperature sensing signal having a first state when the temperature does not exceed a specific temperature and to generate the temperature sensing signal having at least one second state different from the first state when the temperature exceeds the specific temperature, and
   the voltage generator is further configured to generate the first sensing supply voltage in response to the temperature sensing signal having the first state and to generate the at least one second sensing supply voltage in response to the temperature sensing signal having the at least one second state.

3. The dynamic semiconductor memory device of claim 2, wherein the temperature sensor unit comprises:
   a temperature sensor configured to sense the temperature and generate a temperature signal;
   an analog-to-digital converter configured to receive the temperature signal and to convert the temperature signal from an analog signal into a digital signal; and
   a temperature sensing signal generator configured to receive the digital signal and to generate the temperature sensing signal in response to the digital signal.

4. The dynamic semiconductor memory device of claim 3, wherein the voltage generator comprises:
   a reference voltage generator configured to receive an external supply voltage and to generate a first reference voltage and at least one second reference voltage higher than the first reference voltage;
   a switch configured to generate the first reference voltage or the at least one second reference voltage as a reference voltage in response to the temperature sensing signal;
   a comparator configured to compare the reference voltage with the first sensing supply voltage or the at least one second sensing supply voltage and to generate a driving signal when the first sensing supply voltage or the at least one second sensing supply voltage is lower than the reference voltage; and
   a driver configured to drive the first sensing supply voltage or the at least one second sensing supply voltage in response to the driving signal.

5. The dynamic semiconductor memory device of claim 1, further comprising:
   a command decoder and address generator configured to receive a command and address from a source external to the dynamic semiconductor memory device, to generate a mode set command by decoding a command signal included in the command and address, and to generate a mode set code from an address signal included in the command and address; and
   a mode set register configured to generate a temperature sensor enable signal in response to the mode set code, and
   wherein the temperature sensor unit is further configured to sense the temperature and generate the temperature sensing signal in response to the temperature sensor enable signal.

6. The dynamic semiconductor memory device of claim 1, further comprising a command decoder and address generator configured to receive a command and address from a source external to the dynamic semiconductor memory device and to generate a refresh command, a write command, or a read command by decoding a command signal included in the command and address, and
   wherein the temperature sensor unit is further configured to sense the temperature and generate the temperature sensing signal in response to the refresh command, the write command, or the read command.

7. The dynamic semiconductor memory device of claim 6, wherein the sense amplification block comprises:
   precharge circuits configured to precharge the plurality of first bit lines and the plurality of second bit lines during a precharge operation; and
   sense amplifiers, each of which is connected between a corresponding one of the plurality of first bit lines and a corresponding one of the plurality of second bit lines, and is configured to amplify a voltage of the corresponding one of the plurality of first bit lines and a voltage of the corresponding one of the plurality of second bit lines to the first sensing supply voltage or the at least one second sensing supply voltage when at least one word line among the plurality of first word lines and the plurality of second word lines is selected during the sense amplification operation performed in response to the refresh command, the write command, or the read command.

8. A dynamic semiconductor memory device comprising:
a memory cell array comprising:
   a plurality of dynamic memory cells connected between a plurality of word lines and a plurality of bit lines; and
   a plurality of sense amplifiers configured to amplify data of the plurality of bit lines;
a temperature sensor unit configured to sense a temperature and to generate a temperature sensing signal; and
a voltage generator configured to generate a first sensing supply voltage or at least one second sensing supply voltage higher than the first sensing supply voltage in response to the temperature sensing signal and to apply the first sensing supply voltage or the at least one second sensing supply voltage to the memory cell array and to apply a sensing ground voltage to the memory cell array,
wherein the plurality of sense amplifiers are further configured to amplify voltages of bit lines corresponding to dynamic memory cells connected to at least one word line selected from among the plurality of word lines to either the first sensing supply voltage or the at least one second sensing supply voltage during a sense amplification operation.

9. The dynamic semiconductor memory device of claim 8, wherein the temperature sensor unit is further configured to generate the temperature sensing signal having a first state when the temperature does not exceed a specific temperature and to generate the temperature sensing signal having at least one second state different from the first state when the temperature exceeds the specific temperature, and
the voltage generator is further configured to generate the first sensing supply voltage in response to the temperature sensing signal having the first state and to generate the at least one second sensing supply voltage in response to the temperature sensing signal having the at least one second state.

10. The dynamic semiconductor memory device of claim 9, wherein the temperature sensor unit comprises:
a temperature sensor configured to sense the temperature and generate a temperature signal;
an analog-to-digital converter configured to receive the temperature signal and to convert the temperature signal from an analog signal into a digital signal; and
a temperature sensing signal generator configured to receive the digital signal and to generate the temperature sensing signal in response to the digital signal.

11. The dynamic semiconductor memory device of claim 10, wherein the voltage generator comprises:
a reference voltage generator configured to receive an external supply voltage and to generate a first reference voltage and at least one second reference voltage higher than the first reference voltage;
a switch configured to generate the first reference voltage or the at least one second reference voltage as a reference voltage in response to the temperature sensing signal;
a comparator configured to compare the reference voltage with the first sensing supply voltage or the at least one second sensing supply voltage and to generate a driving signal when the first sensing supply voltage or the at least one second sensing supply voltage is lower than the reference voltage; and a driver configured to drive the first sensing supply voltage or the at least one second sensing supply voltage in response to the driving signal.

12. The dynamic semiconductor memory device of claim 8, further comprising:
a command decoder and address generator configured to receive a command and address from a source external to the dynamic semiconductor memory device, to generate a mode set command by decoding a command signal included in the command and address and to generate a mode set code from an address signal included in the command and address; and
a mode set register configured to generate a temperature sensor enable signal in response to the mode set code, and
wherein the temperature sensor unit is further configured to sense the temperature and to generate the temperature sensing signal in response to the temperature sensor enable signal.

13. The dynamic semiconductor memory device of claim 8, further comprising a command decoder and address generator configured to receive a command and address from a source external to the dynamic semiconductor memory device and to generate a refresh command, a write command, or a read command by decoding a command signal included in the command and address, and
wherein the temperature sensor unit is further configured to sense the temperature and to generate the temperature sensing signal in response to the refresh command, the write command, or the read command.

14. The dynamic semiconductor memory device of claim 13, wherein the sense amplification operation is performed in response to the refresh command, the write command, or the read command.

15. A memory system comprising:
a controller configured to transmit a command and address and to transmit or receive data; and
a dynamic memory configured to receive the command and address and to transmit or receive the data,
wherein the dynamic memory comprises:
a memory cell array comprising:
   a plurality of dynamic memory cells connected between a plurality of word lines and a plurality of bit lines; and
   a plurality of sense amplifiers configured to amplify data of the plurality of bit lines;
a temperature sensor unit configured to sense a temperature and to generate a temperature sensing signal; and
a voltage generator configured to generate a first sensing supply voltage or at least one second sensing supply voltage higher than the first sensing supply voltage in response to the temperature sensing signal and to apply the first sensing supply voltage or the at least one second sensing supply voltage to the memory cell array and to apply a sensing ground voltage to the memory cell array, and
wherein the plurality of sense amplifiers amplify voltages of bit lines corresponding to dynamic memory cells connected to at least one word line selected from among the plurality of word lines to either the first sensing supply voltage or the at least one second sensing supply voltage during a sense amplification operation.

16. The memory system of claim 15, wherein the temperature sensor unit is further configured to generate the temperature sensing signal having a first state when the temperature does not exceed a specific temperature and to generate the temperature sensing signal having at least one second state different from the first state when the temperature exceeds the specific temperature, and the voltage generator is further configured to generate the first sensing supply voltage in response to the temperature sensing signal having the first state and generates the at least one second sensing supply voltage in response to the temperature sensing signal having the at least one second state.

17. The memory system of claim 16, wherein the temperature sensor unit comprises:

a temperature sensor configured to sense the temperature and to generate a temperature signal;

an analog-to-digital converter configured to receive the temperature signal, and to convert the temperature signal from an analog signal into a digital signal; and a temperature sensing signal generator configured to receive the digital signal and to generate the temperature sensing signal.

18. The memory system of claim 17, wherein the voltage generator comprises:

a reference voltage generator configured to receive an external supply voltage and to generate a first reference voltage and at least one second reference voltage higher than the first reference voltage;

a switch configured to generate the first reference voltage or the at least one second reference voltage as a reference voltage in response to the temperature sensing signal;

a comparator configured to compare the reference voltage with the first sensing supply voltage or the at least one the second sensing supply voltage and to generate a driving signal when the first sensing supply voltage or the at least one second sensing supply voltage is lower than the reference voltage; and a driver configured to drive the first sensing supply voltage or the at least one second sensing supply voltage in response to the driving signal.

19. The memory system of claim 15, wherein the dynamic memory further comprises a command decoder and address generator configured to generate a refresh command, a write command, or a read command by decoding a command signal included in the command and address, and the temperature sensor unit is further configured to sense the temperature and to generate the temperature sensing signal in response to the refresh command, the write command, or the read command.

20. The memory system of claim 19, wherein the sense amplification operation is performed in response to the refresh command, the write command, or the read command.

* * * * *